(12) United States Patent
Nielsen

(10) Patent No.: US 6,732,555 B1
(45) Date of Patent: May 11, 2004

(54) LOCK FOR A METER BOX LID

(75) Inventor: Jeffery N. Nielsen, Carrollton, TX (US)

(73) Assignee: DFW Plastics, Inc., Bedford, TX (US)

( * ) Notice: Subject to any disclaimer, the term of this patent is extended or adjusted under 35 U.S.C. 154(b) by 0 days.

(21) Appl. No.: 10/340,394

(22) Filed: Jan. 10, 2003

(51) Int. Cl.[7] .............................................. B65D 55/14
(52) U.S. Cl. ........................... 70/169; 70/416; 411/910
(58) Field of Search .......................... 70/416, 418, 419, 70/420, 158–169; 411/910

(56) References Cited

U.S. PATENT DOCUMENTS

| 758,394 A | * | 4/1904 | Szucs ....................... 70/416 X |
| 2,566,370 A | * | 9/1951 | Quinn ........................ 312/333 |
| 3,858,755 A | * | 1/1975 | Tellen ........................ 220/284 |
| 3,921,449 A | * | 11/1975 | Hauffe et al. ................. 73/273 |
| 4,065,020 A | * | 12/1977 | Carson ........................ 220/18 |
| 4,163,503 A | * | 8/1979 | McKinnon .................... 220/18 |
| 5,072,978 A | * | 12/1991 | Woodward ................ 70/416 X |
| 5,327,632 A | * | 7/1994 | Moore ....................... 70/416 X |
| 5,421,074 A | * | 6/1995 | Moore ....................... 70/416 X |
| 5,676,002 A | * | 10/1997 | Hoeptner, III ............... 70/416 |
| 5,771,723 A | * | 6/1998 | Itoh ........................ 70/416 X |
| 5,806,352 A | * | 9/1998 | Axford ..................... 70/416 X |
| 5,901,590 A | * | 5/1999 | Lai ............................. 70/416 |
| 6,145,358 A | * | 11/2000 | Wu ......................... 70/416 X |
| 6,341,927 B2 | * | 1/2002 | Hampson et al. ....... 411/910 X |
| 6,546,767 B1 | * | 4/2003 | Kirejczyk et al. ......... 70/418 X |
| 6,581,421 B2 | * | 6/2003 | Chmela et al. ......... 411/910 X |

* cited by examiner

*Primary Examiner*—Suzanne Dino Barrett
(74) *Attorney, Agent, or Firm*—Geoffrey A. Mantooth; Arthur F. Zobal

(57) ABSTRACT

A securing mechanism is provided which can be attached to a conventional meter box lid which does not require the lid to be redesigned. The securing mechanism comprises a holding member attached to the latch on the underside of the lid. A threaded aperture is formed in said holding member. A bolt having a threaded shaft is extended through the upper wall of the lid from the top side to be secured into the threaded aperture of the holding member for preventing a key from moving the latch member to a release position. In the embodiment disclosed, the bolt has a head with two spaced apart apertures formed therein for receiving two prong of tool for allowing the bolt shaft to be screwed into and from the threaded aperture for locking and release purposes.

4 Claims, 6 Drawing Sheets

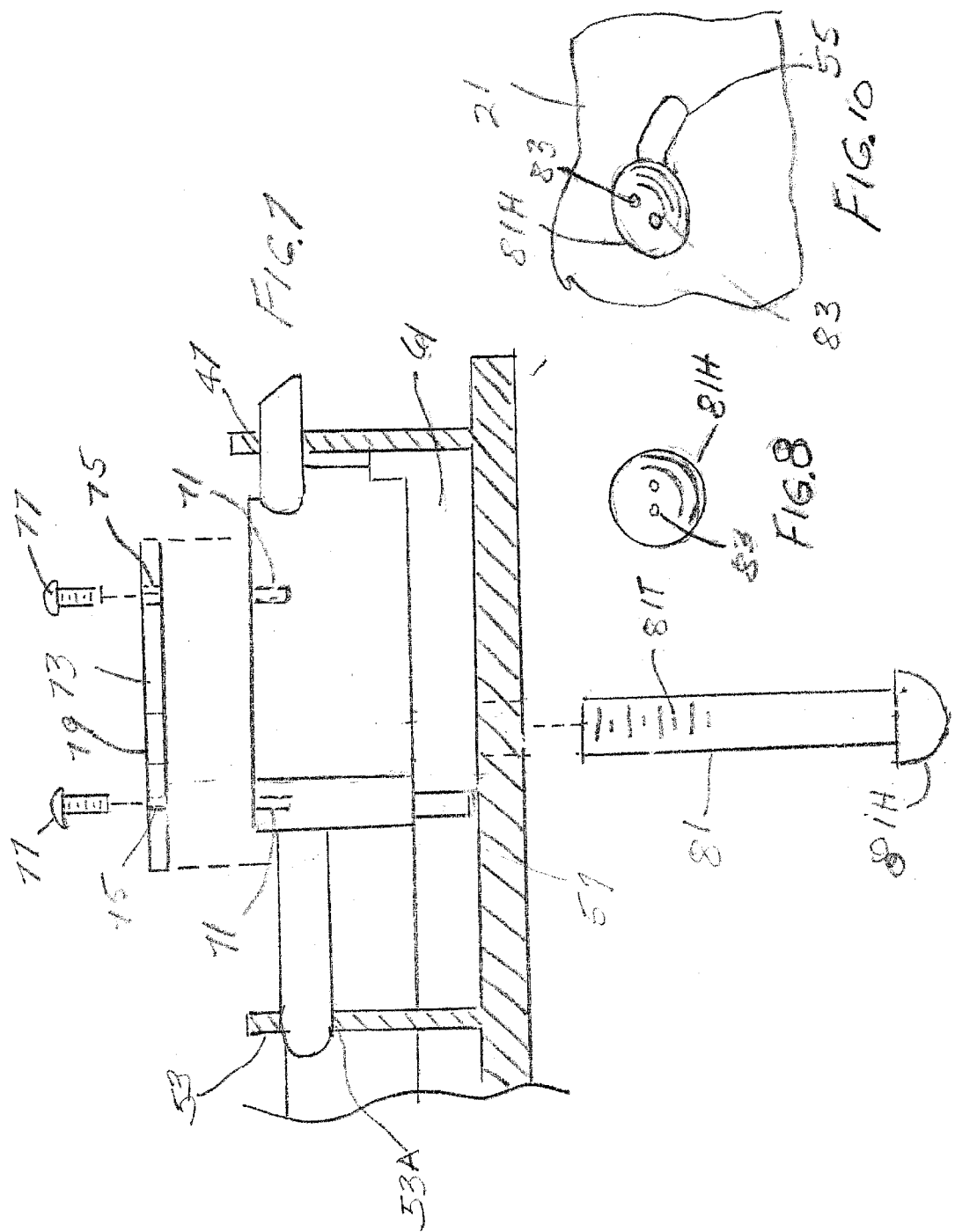

LOCK FOR A METER BOX LID

BACKGROUND OF THE INVENTION

Field of the Invention

Description of the Prior Art

Meter box lids have spring biased latches for securing the lid to a meter box. Generally a hole is formed through the lid to allow a key to be inserted to the underside of the lid to move the latch to a release position to allow the lid to be removed from the box. Thus the latch is not locked in place and it is easy for an unauthorized person to remove the lid from the box.

SUMMARY OF THE INVENTION

It is an object of the invention to provide a lock for a latch securing mechanism which can be attached to a conventional lid that does not require the lid to be redesigned.

In one aspect the lock comprises a holding member attached to the latch on the underside of the lid. A threaded aperture is formed in the holding member. A threaded member is extended through the upper wall of the lid from the top side to be secured into the threaded aperture of the holding member for preventing a key from moving the latch member to a released position.

In the embodiment disclosed, the threaded member has a head on the outside with two spaced apart apertures formed therein for receiving two prongs of a tool for allowing the threaded member to be screwed to the holding member and unscrewed from the threaded aperture for locking and release purposes.

BRIEF DESCRIPTION OF THE DRAWINGS

FIG. 7 is an exploded cross-sectional view of the latch and securing mechanism of FIG. 6.

FIG. 8 is a top view of the head of the bolt of FIG. 7.

FIG. 10 is a plan view of a portion of the top of the lid illustrating the head of a locking bolt used in the invention.

DESCRIPTION OF THE PREFERRED EMBODIMENTS

Figure 1:
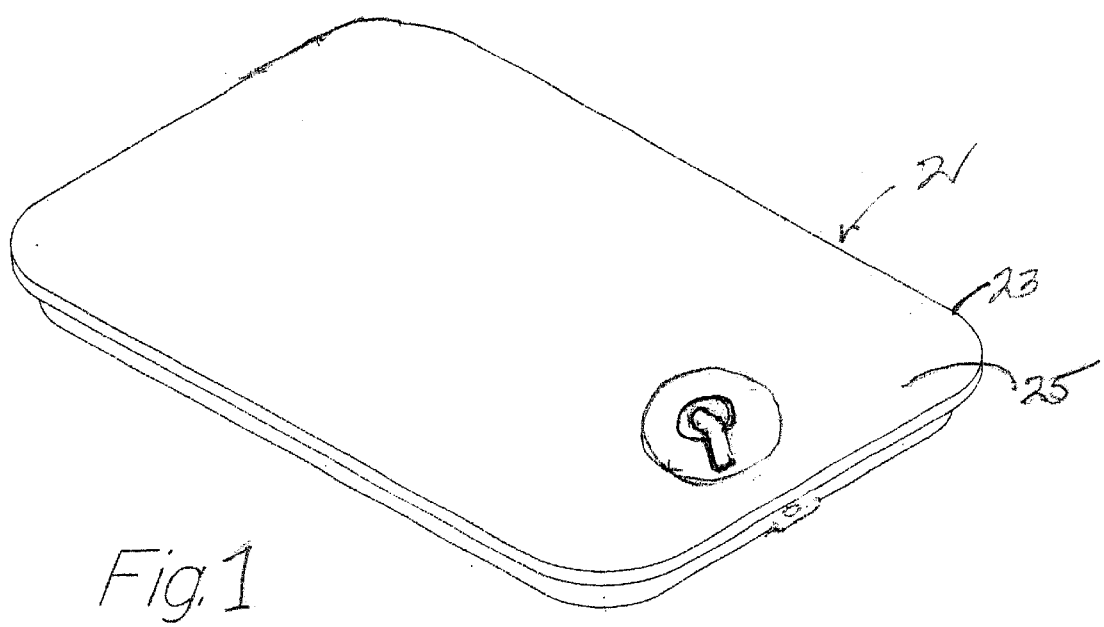
FIG. 1 is an isometric view of the top side of a meter box lid.
Figure 2:
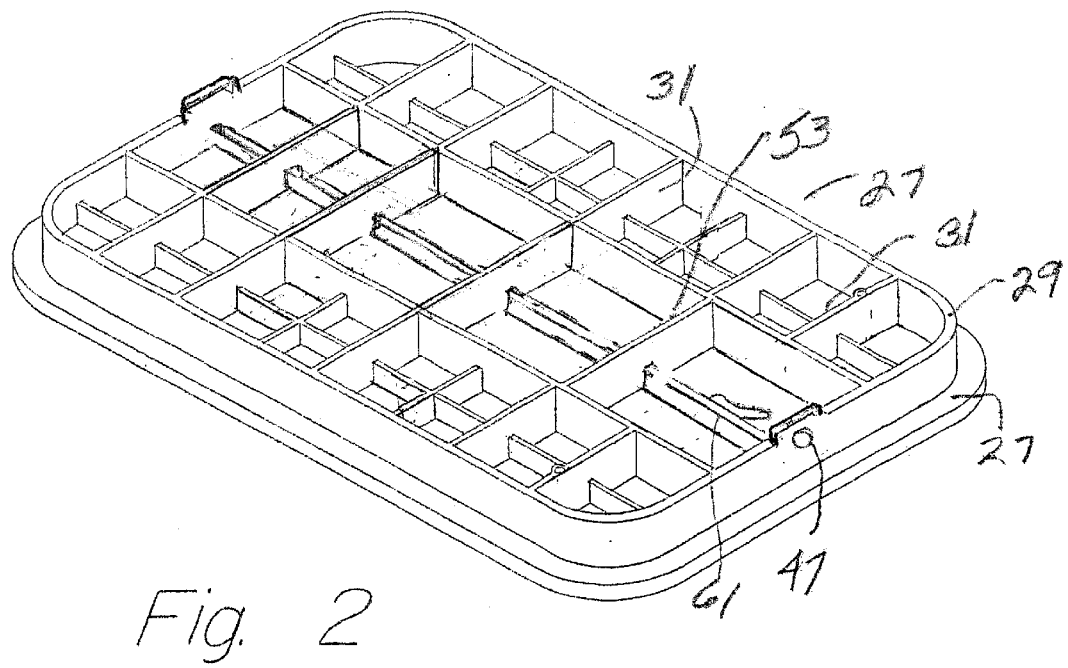
FIG. 2 is an isometric view of the bottom side of the lid of FIG. 1 with its latch removed.
Figure 3:
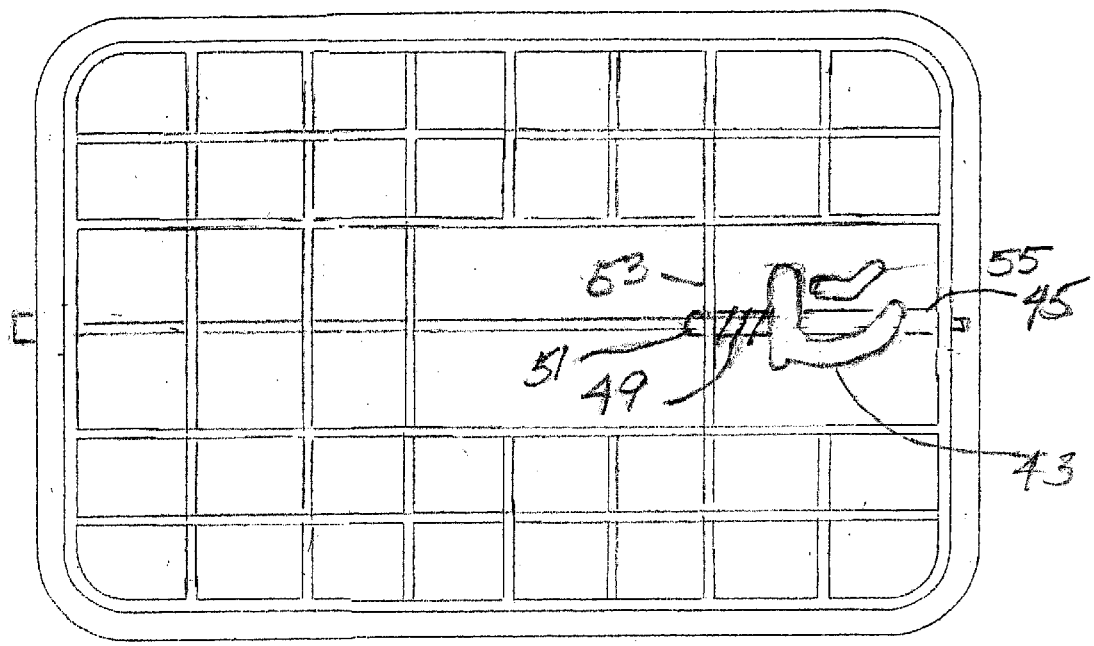
FIG. 3 is a plan view of the bottom side of the lid with a conventional latch in place biased by its spring in a holding position.
Figure 4:
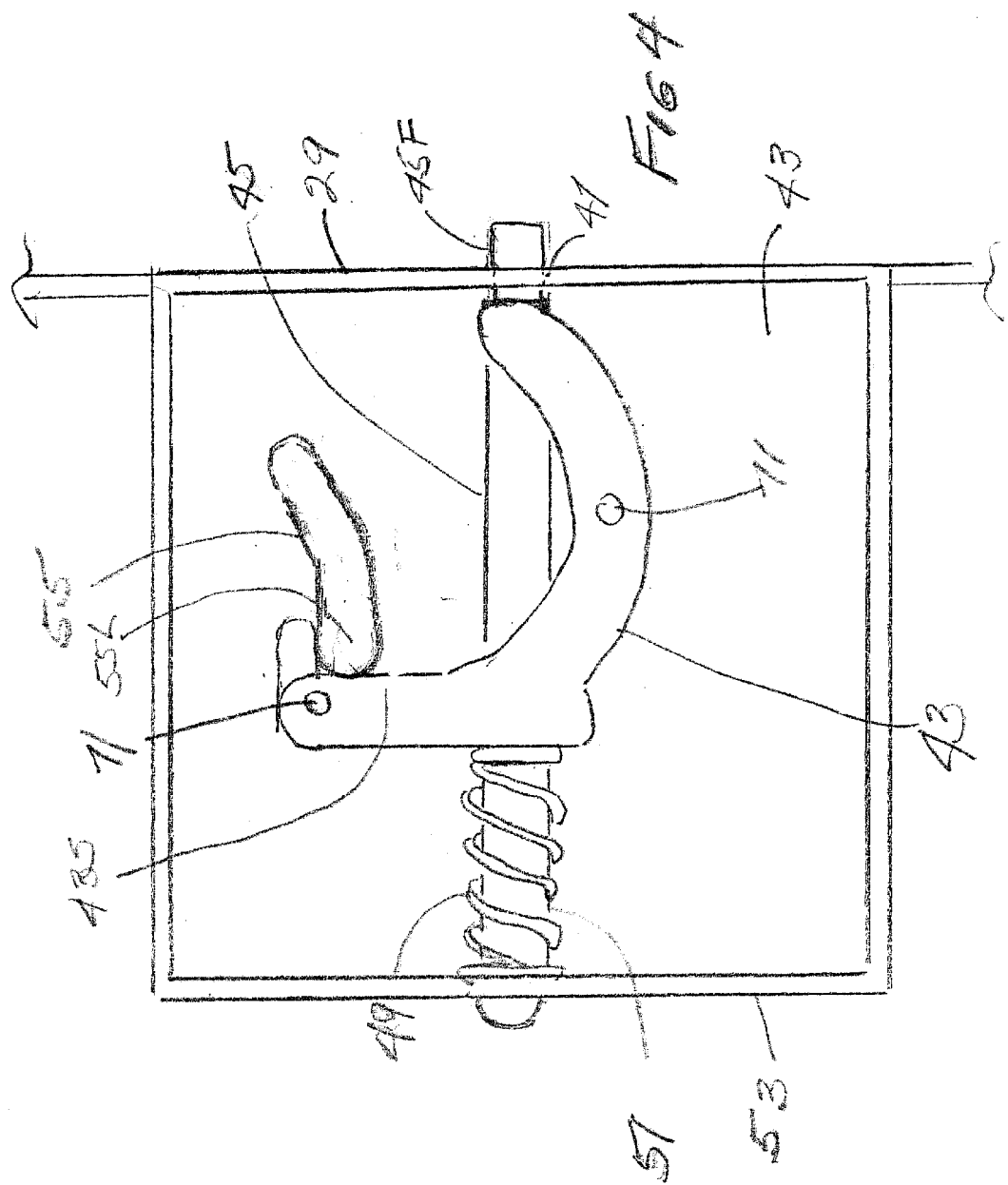
FIGS. 4 and 5 are enlarged plan views of the latch of FIG. 3 in holding and release positions respectively.
Figure 5:
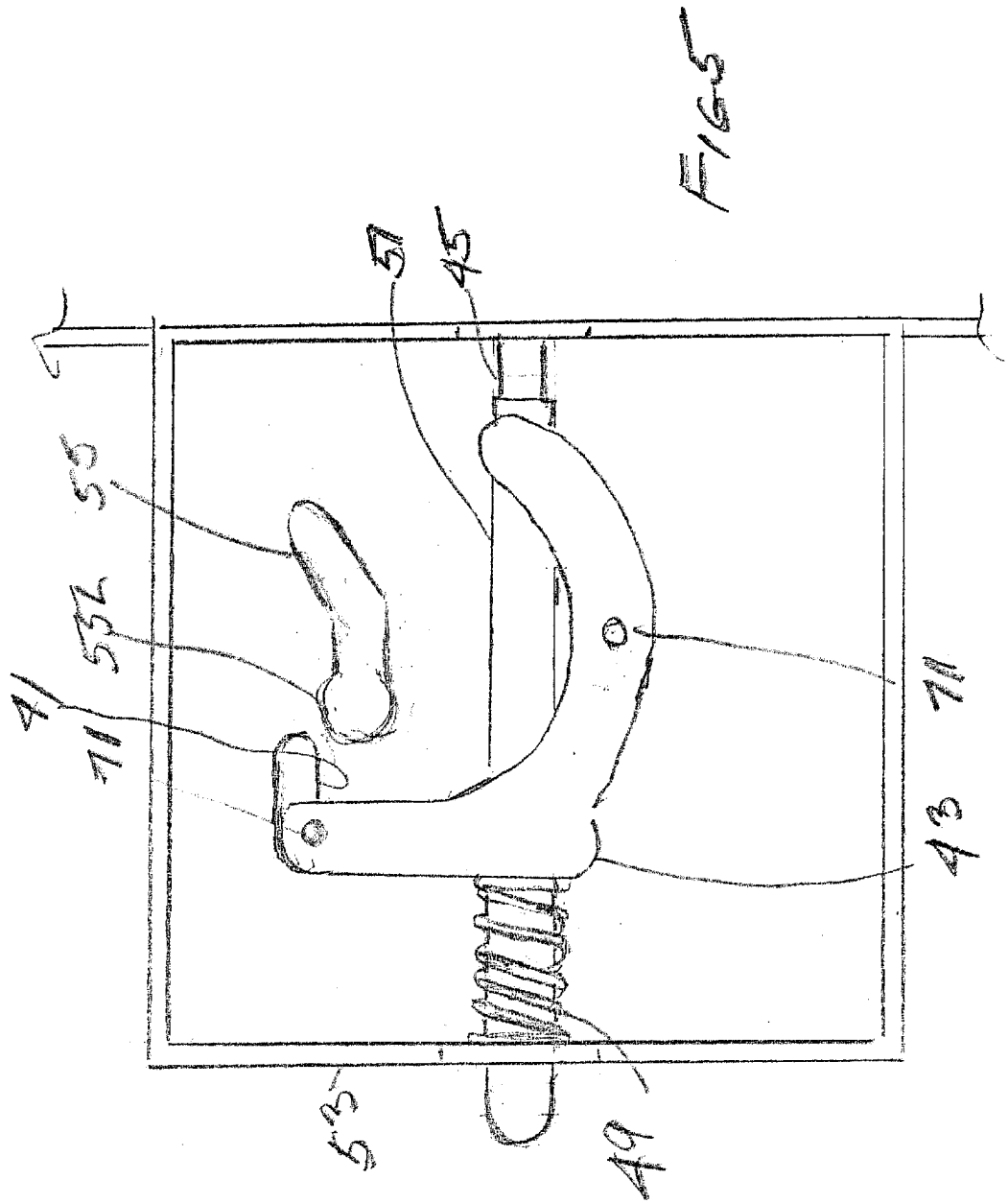

Referring now to the drawings, a typical meter box lid is identified at 21. It comprises an upper wall 23 with an upper side 25 and a lower side 27 with a surrounding side wall 29 extending downward from the lower side of the upper wall. Reinforcing walls 31 are formed within the wall 29. The lid 21 generally is molded from a suitable plastic material. Also provided is a plastic latch 43 which includes a rod 45 having a front end 45F located to be inserted through an aperture 47 formed through the wall 29. A spring 49 is located around the rear end of a rod 51 attached to latch 43 and bears against the rear of the latch 43 and the wall member 53 to normally urge the rod end 45F through the aperture 47 to engage structure of the meter box to hold the lid 21 in place to the meter box. The end of the rod 51 can slide in aperture 53A. A curved key aperture 55 is formed through the wall 23 for receiving a key to be inserted from the top side of the lid to engage the latch structure 43S and move the latch 43 and rod end 45F rearward to a release position wherein the rod end 45F does not engage the meter box such that the lid may be removed from the meter box. The latch 43 has two spaced apart arms 57 (only one of which is shown) which straddle the wall 61 and allows the latch 43 to slide on the wall 61.

Figure 6:
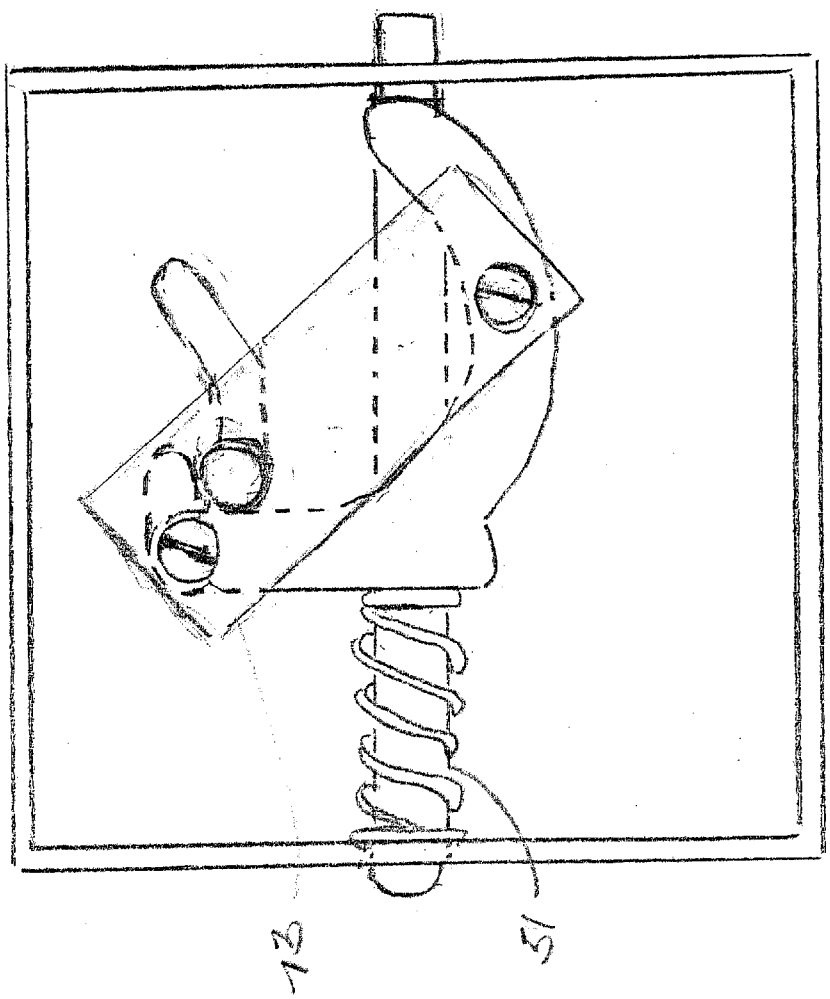
FIG. 6 is an enlarged plan view of the latch showing a plate attached thereto.
Figure 9:
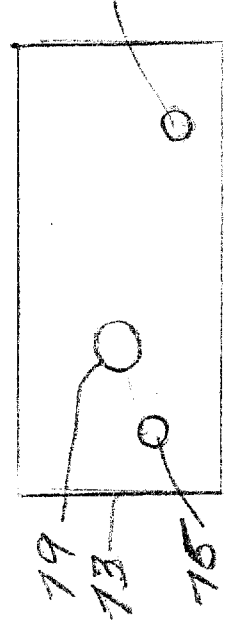
FIG. 9 is a plan view of a holding plate used in the invention.

In accordance with the invention, two threaded spaced apart apertures 71 are formed in the lower side of the latch structure 43 and a metal plate 73 is provided. Two spaced apart threaded apertures 75 are formed through the plate 73 such that they align with the apertures 71 when the plate 73 is placed against the lower surface of the latch structure 43 as shown in FIG. 6. Two screws 77 are inserted through the apertures 75 and are screwed into the apertures 71 of the latch structure 43. The plate 73 has a larger threaded aperture 79 formed therethrough. The key aperture 55 is enlarged at 55L and a metal bolt 81 with threads 81T is inserted through the enlarged portion 55L and screwed into the aperture 79 such that the latch 43 and rod 45 are held fixed in the holding position as shown in FIG. 6. The head 81H of the bolt 81 has two spaced apart pin holes 83 formed therein for receiving two metal prongs connected to a tool to allow the bolt 81 to be screwed into the plate aperture 79 to lock the latch 43 in its holding position which locks the lid 21 to the meter box and to be unscrewed from the plate aperture 79 to allow the key to move the latch 43 and rod 45 to their release position to allow the lid 21 to be removed from the meter box.

The pin holes 83 in effect are an uncommon bolt head slot which will keep most unauthorized persons from removing the lid from the meter box.

The lid 21 is of the type that may be used with a meter box of the type disclosed in U.S. Pat. No. 4,163,503. It is to be understood that the lid may be round to fit into a round meter box.

What is claimed is:

1. An apparatus for locking a lid to a meter box, comprising:

a lid member having an upper wall with an upper side and a lower side and a surrounding side wall extending downward from said lower side of said upper wall;

an aperture extending through said side wall;

a latch comprising an elongated latch member located to extend through said aperture, and movable between a locking and release position;

a spring coupled to said lid for normally biasing said latch member to a locking position wherein a portion of said latch member extends through said aperture to latch said lid to structure of a meter box;

a key receiving aperture extending through said upper wall for receiving a key for engaging said latch for moving said latch member to said release position against the force of said spring whereby said lid may be removed from said meter box;

a holding member coupled to said latch on said lower side of said lid;

a threaded aperture formed in said holding member;

a threaded member adapted to be extended through said upper wall to be screwed into said threaded aperture of said holding member for preventing a key from moving said latch member to said release position.

2. The apparatus of claim 1, wherein:

said threaded member comprises a head with two spaced apart apertures formed therein for receiving two prongs of a tool for allowing said threaded member to be screwed into said threaded aperture and to be unscrewed from said threaded aperture.

3. The apparatus of claim 1, wherein:

said threaded member comprises a bolt having a head and threaded shaft with said threaded shaft being adapted to extend through a portion of said key receiving aperture and screwed into said threaded aperture of said holding member.

4. The apparatus of claim 3, wherein:

said head has two spaced apart apertures formed therein for receiving two prongs of a tool for allowing said threaded shaft to be screwed into said threaded aperture and to be unscrewed from said threaded aperture.

* * * * *